United States Patent [19]

Kadi

[11] Patent Number: 4,540,240
[45] Date of Patent: Sep. 10, 1985

[54] OPTICAL OBJECTIVE ADJUSTING APPARATUS

[75] Inventor: Frank G. Kadi, Santa Clara, Calif.

[73] Assignee: Micronix Partners, Los Gatos, Calif.

[21] Appl. No.: 475,428

[22] Filed: Mar. 15, 1983

[51] Int. Cl.³ .................... G02B 7/04; F16H 21/10
[52] U.S. Cl. ........................................ 350/255; 74/110
[58] Field of Search ........................ 350/255; 74/110

[56] References Cited

U.S. PATENT DOCUMENTS

| | | | |
|---|---|---|---|
| 2,662,444 | 12/1953 | Gradisar | 350/255 |
| 2,693,708 | 11/1954 | Baer, Sr. et al. | 74/110 |
| 3,731,548 | 5/1973 | Brocksruker | 74/96 |
| 4,307,941 | 12/1981 | Dziemba | 350/255 |
| 4,317,383 | 3/1982 | Kurosaki et al. | 74/110 |

FOREIGN PATENT DOCUMENTS 52-9462  1/1977  Japan ................................ 350/255

OTHER PUBLICATIONS

Graham, M. D., "A Piezoelectric Fine-Focusing Optical Mount", Rev. Sci. Instruments, 8-1974, pp. 1026-1027.

Kranik et al., "X-Y Stage Drive", IBM Tech. Disc. Bull., 9-1972, pp. 1107-1108.

*Primary Examiner*—William H. Punter
*Attorney, Agent, or Firm*—Alan H. MacPherson; Thomas S. MacDonald; Terrence E. Dooher

[57] ABSTRACT

An adjusting means for a microscope objection (51a) or the like is provided comprising a fixed support (53), a piezomotor (52) having an output ram (54) capable of accurate incremental movement and which is adapted to strike a flexible leg or lever (55) which amplifies the incremental ram movement. The cantilevered end (57) of leg (55) moves arcuately to strike a second oppositely extending lever (60) which is journalled in a flexure pivot (61). Lever (60) extends back toward the objective (50a) and further accurately amplifies the incremental ram movement so as to move the objective a finite distance based on electrical inputs to the piezomotor.

14 Claims, 4 Drawing Figures

OPTICAL OBJECTIVE ADJUSTING APPARATUS

BACKGROUND OF THE INVENTION

1. Field of the Invension

The present invention is directed to an extremely accurate axial adjusting means for objectives and other devices with extremely limited depth of focus which must be moved linearly with high precisions of the order of 0.4 micron resolution. The device particularly finds application for the movement of objectives in an X-ray lithography system used in the fabrication of semiconductors formed in silicon wafers. Objectives are used in the alignment and registration of wafers and fabrication masks so that a sequence of successive masks may very accurately be aligned, moved and gapped with respect to a wafer.

2. Description of the Prior Art

Heretofore, movement of the objectives has been by an appropriate gearing of lead-screw linear motors directly coupled to the objectives. These mechanisms are susceptible to backlash, are cumbersome, large, and not capable of long-term use for the accuracies being sought.

SUMMARY

An improved, highly-accurate, compact adjusting means, particularly useful in adjusting high resolution microscope objectives for semiconductor X-ray lithography fabrication utilizes piezomotors and a multiple lever flexural system for magnifying the small accurate linear movement of a piezomotor output to a wider range accurate linear movement. An electrical signal indicative of the desired movement or positioning of the objective as dictated, for example, by the matching of alignment marks on a semiconductor wafer and mask, is inputted into each piezomotor. The lever arms are folded back on one another in spaced relation with each lever arm movably held in a flexure pivot. whereby all frictional bearing surfaces are eliminated. Magnification of piezomotor movement of over twenty times is provided with accuracies and resolutions of 0.02 microns being possible. The adjusting means is completely clearance free and capable of continued accuracies over long periods of use. There are no wear surfaces except for the linear objective rails and no other high-precision machined parts are required.

DETAILED DESCRIPTION

Figure 1:
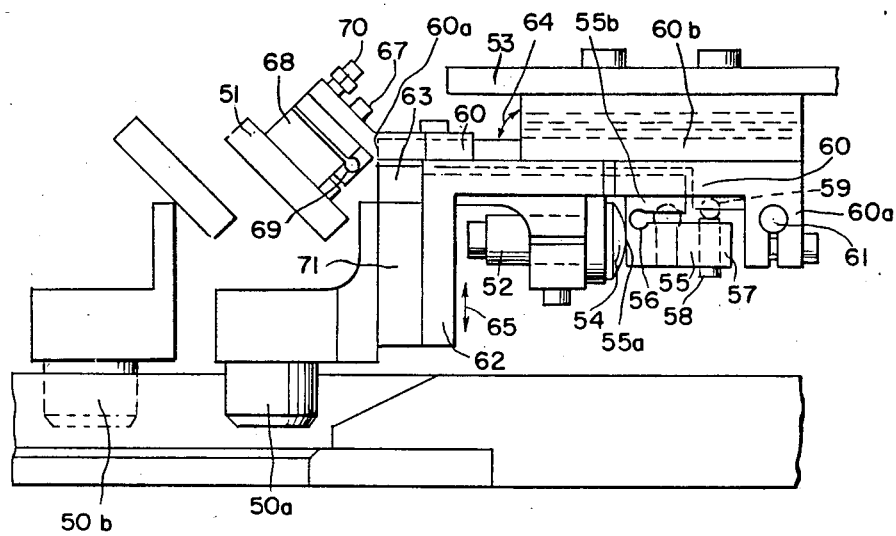
FIG. 1 is a side elevation view of the microscope objective adjusting means.
Figure 2:
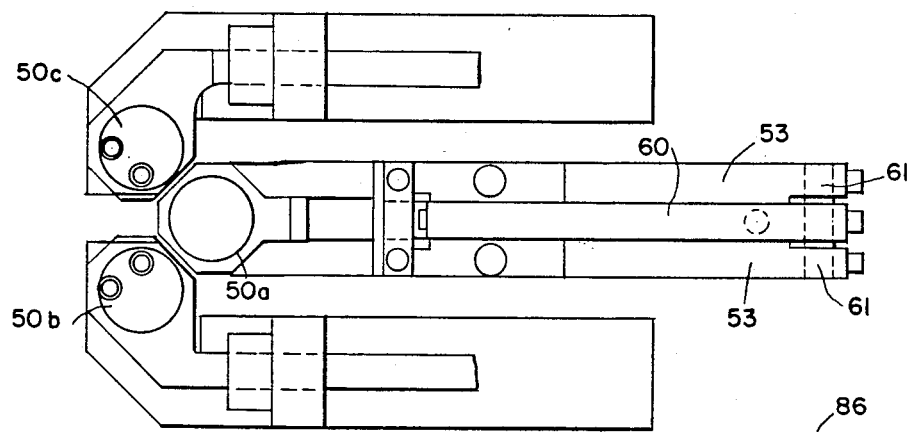
FIG. 2 is a top plan view of the adjusting means.

FIG. 1 shows the details of one of three duplicate adjusting means, one for each of objectives 50a, 50b and 50c (FIG. 2). Dependent on the particular technical application, generally either one, two or three objectives are employed. Each may be individually adjusted in accord with the invention. A piezoelectric/motor 52 is provided which in response to an electrical signal initiates movement of a piezo output ram 54 over a small, accurately determined incremental linear distance against a vector force point 55a on a rearwardly extending lower first lever 55. Lever 55 is formed as the lower leg of a C-shaped flexure member, the upper leg 55b of which is secured to fixed support 53. The intermediate part of the C-shaped member is narrowed by a lateral bore so that it forms an integral flexible link 56 around which leg or lever 55 rotates. Lever 55 has a cantilevered end 57 containing an adjustable pin 58 extending from its top surface. Upon movement of the piezo ram outwardly (to the right in FIG. 1), fulcrum lever 55 flexes around flexure pivot 56, magnifies the incremental linear movement from the ram due to the fulcrum length and moves upwardly to allow pin 58 to push against a fixed ball 59 contained on a lower surface of a second forwardly extending upper lever 60 foldedback on but spaced from lever 55.

Lever 60 is supported by a journalled flexure pivot 61 extending horizontally from the sides of lever arm 60 to support frame 53a of fixed support 53. The flexure pivot 61 may be pressed fit into apertures at the ends of arms 53 and in second lever 60. The second lever is L-shaped having its short bottom leg 60a extending vertically downwardly. Leg 60a is journalled to receive a central portion of flexure 61. The long leg 60b of the lever extends fowardly and horizontally toward the device or objective to be moved.

Pin 58 exerts an upward force on ball 59 which pivots lever arm 60 upwardly around fixed flexure pivot 61 resulting in the forward end 60b of leg 60b being moved arcuately upwardly as shown by arrows 64, further magnifying, as a result of the second lever arm fulcrum length, the incremental movement of the ram 54. The sides 62 of objective mount 71 have a vertical tongue or groove which is adapted to ride vertically, as shown by arrows 65, in a groove or tongue contained on rails (not shown) fixedly attached with respect to support arms 53 which are attached to the system outer housing. Movement of piezo ram inwardly reverses the motion of the levers and objective due to the restorative force of the respective flexures. Flexure 61 acts as the restorative force to move the strip 63 and mount 71 upwardly.

A flat flexible strip 63 made from beryllium copper is fixed to and extends downwardly from end 60a of lever 60 to objective mount 71 and communicates the downward movement of lever arm 60 to give linear vertical movement to mount 71.

Figure 3:
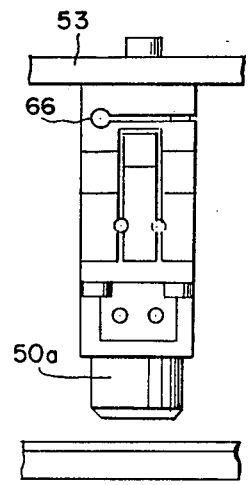
FIG. 3 is a rear view of the adjusting means taken at the right side of FIG. 1.

Connected to fixed support arm 53 is an adjusting means for the binocular optics 51. This comprises adjustment screw 67 wherein downward actuation of the screw forces optics-holding member 68 downwardly around flexure pivot 69. This is useful in providing for a minute adjustment of the angle leading from the objective 50a to the eyepiece (not shown). Flexure 66 (FIG. 3) is utilized to adjust the angular orientation of the objective.

Piezomotor 52 is fixedly supported with respect to support frame 53. These motors are available from Burleigh Manufacturing Company of Fishers, N.Y. and are sold under the trademark PZT Pushers. They include a series of clamps which allow movement of the piezo ram in linear incremental steps of $0.02\mu$ per step. Clamps are ceramic elements whose annular openings vary with imposed voltage.

Figure 4:
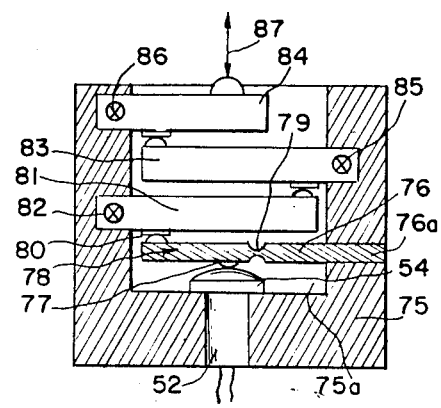
FIG. 4 is a partial sectional side view of another embodiment of the lever operated adjusting means.

FIG. 4 shows a three lever embodiment of the invention, a unit of which can be utilized to adjust each of the objectives. The piezoelectric linear motor 52 is fixed in a bottom wall of casing 75 with the motor ram 54 extending into lever cavity 75a. A first flexure 76 has an end 76a held in a wall of the casing. A narrowed bending link portion 79 is positioned between the fixed end 76a and a bearing 77 which abuts piezo ram 54. The outer end 78 of the flexure is positioned to abut through bearing 80 a first lever 81 mounted by flexure 82 at one end. Lever 81 abuts at its other end a second folded-back lever 83 mounted by flexure 85 on one end and containing a bearing on its other end which abuts a third folded-back (in the same direction as the lever 81) lever 84 mounted on flexure 86. Lever 84 has an output motion inward and outward from casing 75 as shown by arrow 87. This is the motion which then moves the objectives in their rails or other linear slide device.

Outward motion of ram 54 (upward in FIG. 4) moves end 78 up and contact 80 and arms 81, 83 and 84 down reversing the direction of arrow 87. Each of the flexures are "set" so that they have a downward return force so the abutting surfaces stay in contact. Conversely, inward motion of ram 54 (downward in FIG. 4) moves end 78 down and contact 80 and arms 81, 83 and 84 up in the direction of arrow 87.

The use of the two and three lever folded-back flexure fulcrum system described above translates the minute accurate linear horizontal motion of the piezomotor ram to a large vertical arcuate motion of the forward end of the second or third lever (and a large vertical linear motion of the objective). By reason of the length of the respective fulcrum lever arms 55 and 60 in the two-lever embodiment, in a particular application of the adjusting means for objectives used in an X-ray lithography system for fabrication of semiconductor wafers, a 23:1 magnification of the piezo ram movement is provided. The system is very compact and of high accuracy and resolution, being able to have accurate placement of the objective within 0.4 microns. The travel magnifying system is completely free of bearing wear or clearance problems since there are no bearings, the system relying entirely on flexures connected to the lever arms to accurately magnify motion.

The system finds particular utility in 1, 2 or 3 objective microscope systems used in conjunction with semiconductor lithography apparatus such as that employing X-ray, ultraviolet or ion or electron beam devices.

The above description of embodiments of this invention is intended to be illustrative and not limiting. Other embodiments of this invention will be obvious to those skilled in the art in view of the above disclosure.

I claim:

1. An optical objective device to be moved linearly, including means for moving the device to a particular location over a prescribed length of travel, said means comprising:
   a fixed support relative to which linear movement of the device is desired;
   means including a piezoelectric motor fixed with respect to said support for initiating an accurate incremental linear movement;
   a first flexure fulcrum lever means having a first portion juxtaposed to and in contact with said piezomotor for receiving such incremental movement, said first lever means magnifying said linear movement;
   a second flexure fulcrum lever means having a first end in contact with a second portion of said first flexure fulcrum lever means for receiving said magnified linear movement, said second lever means further magnifying said linear movement;
   means for attaching said device to a second end of said second fulcrum lever means; and
   means for supporting said device linearly with respect to said fixed support.

2. The invention of claim 1 in which said first fulcrum lever means extends from said piezoelectric motor in a first direction and said second fulcrum lever means is folded-back in spaced relation from said first fulcrum lever means and extends toward said motor.

3. The invention of claim 2 in which said motor is positioned on a linear axis, said second portion of said first fulcrum lever means extending above said first portion of said fulcrum lever means and the axis of said motor and wherein said means for attaching said device is positioned substantially perpendicular to said linear axis and is displaced from an end of said motor in a direction opposite to said first direction.

4. The invention of claims 1, 2 or 3 in which said device is a microscope objective.

5. The invention of claims 1, 2 or 3 wherein said device comprises multiple objectives, each objective being positioned for independent movement relative to said fixed support and attached to separate means for moving as recited.

6. The invention of claims 1, 2 or 3 wherein said device is one of a multiplicity of optical objectives positioned in an X-ray, ultraviolet or ion beam semiconductor lithography apparatus for aligning semiconductor wafers and wafer masks.

7. The invention of claim 1 in which said first flexure fulcrum lever means comprises a C-shaped block member having a first leg fixedly attached relative to said fixed support, a second leg forming said first portion of said first flexure fulcrum lever means and having a cantilevered end amplifying said incremental linear movement and a narrowed medial portion forming an integral flexible link between said first and second legs.

8. The invention of claim 7 including pin means adjustably attached to and extending from said cantilevered end of said second leg for moving said second flexure fulcrum means.

9. The invention of claim 7 in which said second flexure fulcrum lever means comprises a 90° L-shaped member having a bottom leg extending vertically downwardly and journalled to receive a flexure supported on said fixed support, and a top leg extending substantially horizontal and in a reverse direction from said second leg of said first fulcrum lever means.

10. The invention of claim 1 in which said means for attaching includes additional flexure fulcrum lever means for further magnification of lever movement.

11. An optical objective to be moved linearly including means for moving the objective to a particular location over a prescribed length of travel, said means comprising:
   a fixed support relative to which linear movement of the objective is desired;
   a piezoelectric motor operably connected to said support and a linearly incrementally movable piezo ram extending from said motor;
   a first lever positioned in a first plane and having a first end in contact with said piezo ram;
   a first flexure means connected to said first end of said lever for allowing to and fro flexure of said lever upon linear movement of said ram;
   a second lever extending in a second plane displaced from the plane of said first lever;

means adjacent a second end of said first lever to contact a point on said second lever inward of a first end of said second lever;
a second flexure means having a first portion connected to said first end of said second lever outward of said point and a second portion fixed with respect to said support; and
means at a second end of said second lever for flexibly connecting said second end of said second lever to said objective.

12. The invention of claim 11 in which said first lever and first flexure means comprises a C-shaped block member having a first top leg attached to said fixed support, a narrowed central portion forming an integral flexible ink and a second bottom leg having a cantilevered end opposite said link, amplifying movement of said ram.

13. The invention of claim 11 in which said second lever comprises a 90° L-shaped member having its bottom leg extending downwardly and journalled for receiving a central portion of said second flexure means and a top leg extending substantially horizontal and in a reverse direction from said first lever further amplifying movement of said ram.

14. The invention of claim 11 including multiple objectives, each being movable independently with respect to said fixed support and each attached to a separate one of the recited means for moving.

* * * * *